(12) United States Patent
Lee et al.

(10) Patent No.: US 9,525,098 B2
(45) Date of Patent: Dec. 20, 2016

(54) SOLAR CELL AND METHOD OF MANUFACTURING THE SAME

(71) Applicant: LG ELECTRONICS INC., Seoul (KR)

(72) Inventors: Sungeun Lee, Seoul (KR); Youngho Choe, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/301,183

(22) Filed: Jun. 10, 2014

(65) Prior Publication Data

US 2014/0295614 A1  Oct. 2, 2014

Related U.S. Application Data

(62) Division of application No. 12/858,108, filed on Aug. 17, 2010, now Pat. No. 8,779,280.

(30) Foreign Application Priority Data

Aug. 18, 2009 (KR) .................. 10-2009-0076224
Aug. 18, 2009 (KR) .................. 10-2009-0076228

(51) Int. Cl.
*H01L 31/18* (2006.01)
*H01L 31/0224* (2006.01)
(Continued)

(52) U.S. Cl.
CPC ........... *H01L 31/18* (2013.01); *H01L 31/0236* (2013.01); *H01L 31/022425* (2013.01);
(Continued)

(58) Field of Classification Search
CPC .... H01L 31/18; H01L 31/1804; H01L 31/186; H01L 31/1864; H01L 31/20; H01L 31/0224; H01L 31/022425; H01L 31/022421
See application file for complete search history.

(56) References Cited

U.S. PATENT DOCUMENTS 5,543,333 A      8/1996  Holdermann
6,556,030 B1 *   4/2003  Akram ................. G01R 1/0466
                                           324/750.05
(Continued)

FOREIGN PATENT DOCUMENTS

JP   2000-294819 A   10/2000
JP   2007-88254 A    4/2007
(Continued)

*Primary Examiner* — Matthew Martin
(74) *Attorney, Agent, or Firm* — Birch, Stewart, Kolasch & Birch, LLP

(57) ABSTRACT

A solar cell and a method of manufacturing a solar cell are disclosed. The solar cell includes forming a first doped region of a first conductive type and a second doped region of a second conductive type opposite the first conductive type on a semiconductor substrate of the first conductive type; forming a passivation layer on the semiconductor substrate to expose a portion of each of the first and second doped regions; and forming a first electrode electrically connected to the first doped region and a second electrode electrically connected to the second doped region, wherein the forming of the first and second electrodes includes forming a metal seed layer directly contacting the first doped region and a metal seed layer directly contacting the second doped region, and forming a conductive layer on the metal seed layer of each of the first and second electrodes.

23 Claims, 5 Drawing Sheets

(51) Int. Cl.
*H01L 31/0236* (2006.01)
*H01L 31/068* (2012.01)
*H01L 31/00* (2006.01)

(52) U.S. Cl.
CPC ........ *H01L 31/068* (2013.01); *H01L 31/1804* (2013.01); *Y02E 10/52* (2013.01); *Y02E 10/547* (2013.01); *Y02P 70/521* (2015.11)

(56) References Cited

U.S. PATENT DOCUMENTS

| | | | |
|---|---|---|---|
| 2003/0172969 A1* | 9/2003 | Jenson | H01L 31/022425 136/252 |
| 2004/0200520 A1* | 10/2004 | Mulligan | H01L 31/022441 136/256 |
| 2006/0060238 A1 | 3/2006 | Hacke et al. | |
| 2008/0128019 A1 | 6/2008 | Lopatin et al. | |
| 2008/0142070 A1* | 6/2008 | Lechner | H01L 31/0201 136/244 |
| 2008/0202577 A1 | 8/2008 | Hieslmair | |
| 2008/0210301 A1 | 9/2008 | Mulligan et al. | |
| 2009/0280635 A1* | 11/2009 | Mathew | H01L 21/26506 438/602 |

FOREIGN PATENT DOCUMENTS

| | | |
|---|---|---|
| KR | 10-2008-0075156 A | 8/2008 |
| KR | 10-2009-0050756 A | 5/2009 |
| KR | 10-2011-0018651 A | 2/2011 |
| WO | WO 2007/106180 A2 | 9/2007 |

\* cited by examiner

SOLAR CELL AND METHOD OF MANUFACTURING THE SAME

CROSS-REFERENCE TO RELATED APPLICATIONS

This application is a Divisional of co-pending application Ser. No. 12/858,108 filed Aug. 17, 2010, which claims priority to Korean Patent Application Nos. 10-2009-0076224 filed in the Republic of Korea on Aug. 18, 2009, and 10-2009-0076228 filed in the Republic of Korea on Aug. 18, 2009, the entire contents of which are incorporated herein by reference.

BACKGROUND OF THE INVENTION

Field of the Invention

Example embodiments of the invention relate to a solar cell and a method of manufacturing the same.

Description of the Related Art

Recently, as existing energy sources such as petroleum and coal are expected to be depleted, interests in renewable energy sources for replacing the existing energy sources are increasing. As a source of the renewable energy, solar cells for generating electric energy from solar energy have been particularly spotlighted.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell having the above-described structure, electrons inside the semiconductors become free electrons (hereinafter referred to as "electrons") by the photoelectric effect. Further, electrons and holes respectively move to the n-type semiconductor (e.g., the emitter layer) and the p-type semiconductor (e.g., the substrate) based on the principle of the p-n junction. The electrons moving to the emitter layer and the holes moving to the substrate are respectively collected by an electrode connected to the emitter layer and an electrode connected to the substrate.

A solar cell capable of increasing the size of a light receiving area by forming both an electron electrode and a hole electrode on a back surface of the substrate (i.e., the surface of the substrate on which light is not incident) has been recently developed. Hence, the efficiency of the solar cell is improved.

SUMMARY OF THE INVENTION

In one aspect, there is a solar cell including a first doped region of a first conductive type formed on a semiconductor substrate of the first conductive type, a second doped region formed on the semiconductor substrate at a location adjacent to the first doped region, the second doped region having a second conductive type opposite the first conductive type, a passivation layer configured to expose a portion of each of the first and second doped regions, a first electrode formed on the exposed portion of the first doped region, the first electrode including a metal seed layer directly contacting the first doped region, and a second electrode formed on the exposed portion of the second doped region, the second electrode including a metal seed layer directly contacting the second doped region.

The metal seed layer of each of the first and second electrodes is formed of nickel silicide including $Ni_2Si$, $NiSi$, $NiSi_2$, etc., and the metal seed layer formed of nickel silicide has a thickness of about 50 nm to 200 nm.

The metal seed layer of each of the first and second electrodes is formed of a material containing vapor deposited aluminum, and the metal seed layer formed of vapor deposited aluminum has a thickness of about 50 nm to 200 nm. The metal seed layer formed of vapor deposited aluminum is used as a seed layer of a plating process through zincate processing in a subsequent process.

Each of the first and second electrodes further includes at least one conductive layer positioned on the metal seed layer of each of the first and second electrodes. The at least one conductive layer of each of the first and second electrodes may be formed of at least one selected from the group consisting of copper (Cu), silver (Al), aluminum (Al), tin (Sn), zinc (Zn), indium (In), titanium (Ti), gold (Au), and a combination thereof.

The at least one conductive layer of each of the first and second electrodes may include a copper layer and a tin layer sequentially positioned on the metal seed layer of each of the first and second electrodes. The copper layer may have a thickness of about 10 µm to 30 µm, and the tin layer may have a thickness of about 5 µm to 15 µm.

Each of the first and second electrodes further includes a diffusion barrier layer that is positioned between the metal seed layer and the at least one conductive layer of each of the first and second electrodes to prevent a formation material, for example, copper of the at least one conductive layer from being diffused to a silicon interface through the metal seed layer of each of the first and second electrodes. The diffusion barrier layer of each of the first and second electrodes may contain nickel and has a thickness of about 5 µm to 15 µm.

A surface of the semiconductor substrate in which the first and second doped regions are not formed may be textured to form a textured surface. An anti-reflection layer may be formed on the textured surface of the semiconductor substrate.

In another aspect, there is a method of manufacturing a solar cell including forming a first doped region of a first conductive type and a second doped region of a second conductive type opposite the first conductive type on a semiconductor substrate of the first conductive type, forming a passivation layer on the semiconductor substrate to expose a portion of each of the first and second doped regions, and forming a first electrode electrically connected to the first doped region and a second electrode electrically connected to the second doped region.

The forming of the first and second electrodes includes forming a metal seed layer directly contacting the first doped region and a metal seed layer directly contacting the second doped region and forming a conductive layer on the metal seed layer of each of the first and second electrodes.

The forming of the metal seed layer of each of the first and second electrodes may include depositing a seed material containing nickel to a thickness of about 50 nm to 200 nm using a vacuum method and performing a thermal processing at a temperature of about 300° C. to 600° C. in the nitrogen atmosphere. According to the above-described process, a nickel silicide layer (including $Ni_2Si$, $NiSi$, $NiSi_2$, etc.) directly contacting each of the first and second doped regions may be formed.

The forming of the metal seed layer of each of the first and second electrodes may include depositing nickel onto a surface of each of the first and second doped regions to a thickness of about 50 nm to 200 nm through an electroless plating method using an electrolyte containing a nickel precursor and performing a thermal processing at a temperature of about 300° C. to 600° C. in the nitrogen atmosphere. According to the above-described process, a nickel silicide layer (including $Ni_2Si$, $NiSi$, $NiSi_2$, etc.) directly contacting each of the first and second doped regions may be formed.

The forming of the metal seed layer of each of the first and second electrodes may include depositing a seed material containing aluminum and performing a zincate processing on an aluminum surface.

It is preferable that the seed material containing aluminum is deposited to a thickness of about 50 nm to 200 nm using a vacuum method including a sputtering method and an electron beam evaporation method.

The forming of the metal seed layer of each of the first and second electrodes may further include performing a thermal processing on vapor deposited aluminum. The thermal processing of vapor deposited aluminum may be performed at a temperature of about 350° C. to 500° C. in the hydrogen atmosphere. According to the above-described process, an aluminum seed layer formed of vapor deposited aluminum directly contacting each of the first and second doped regions may be formed.

The forming of the conductive layer of each of the first and second electrodes may include forming a conductive material layer on the metal seed layer of each of the first and second electrodes. The conductive material layer may be formed of at least one selected from the group consisting of copper (Cu), silver (Ag), aluminum (Al), tin (Sn), zinc (Zn), indium (In), titanium (Ti), gold (Au), and a combination thereof.

The forming of the conductive material layer may include plating copper on the metal seed layer of each of the first and second electrodes to a thickness of about 10 μm to 30 μm to form a copper layer and plating tin on the copper layer to a thickness of about 5 μm to 15 μm to form a tin layer.

The forming of the first and second electrodes may further include forming a diffusion barrier layer between the metal seed layer and the conductive layer. The forming of the diffusion barrier layer may include plating nickel on the metal seed layer to a thickness of about 5 μm to 15 μm using an electroplating method.

The first and second doped regions may be simultaneously formed. For example, the forming of the first and second doped regions includes forming a first layer containing first impurities of the second conductive type in a portion of the semiconductor substrate to form the second doped region, forming a second layer containing second impurities of the first conductive type on the first layer and the semiconductor substrate, and diffusing the first layer and the second layer into the semiconductor substrate to form the first doped region doped with the first impurities and the second doped region doped with the second impurities.

The forming of the passivation layer may include forming the passivation layer on the entire surface of the semiconductor substrate, applying an etching paste to a portion of the passivation layer, and performing a thermal processing to remove the passivation layer of a formation portion of the etching paste. The etching paste may contain at least one of phosphoric acid and hydrofluoric acid.

The forming of the passivation layer may include forming the passivation layer on the entire surface of the semiconductor substrate, applying an etch resist paste to a portion of the passivation layer, hardening the etch resist paste, and performing a wet etching process using the hardened etch resist paste as a mask to selectively remove the passivation layer. An etchant used in the wet etching process may contain hydrofluoric acid.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Figure 1:
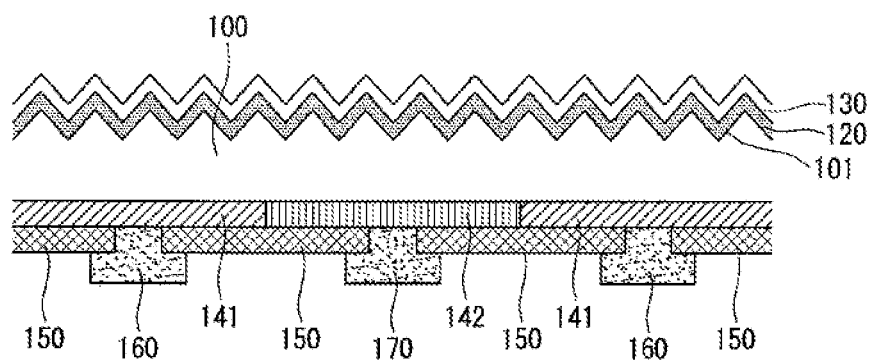
FIG. 1 is a partial cross-sectional view of a solar cell according to an example embodiment of the invention.

Embodiments of the invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
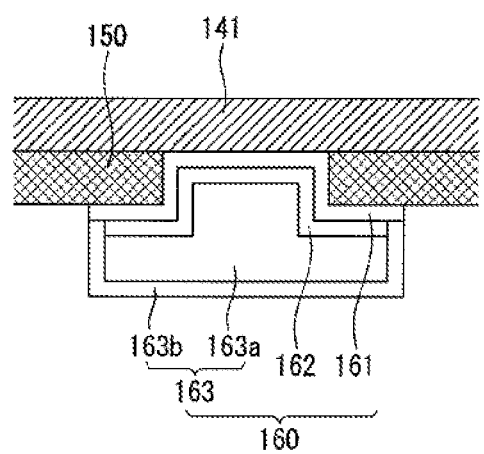
FIG. 2 is an enlarged cross-sectional view of a first electrode shown in FIG. 1.

FIG. 1 is a partial cross-sectional view of a solar cell according to an example embodiment of the invention. FIG. 2 is an enlarged cross-sectional view of a first electrode shown in FIG. 1.

As shown in FIGS. 1 and 2, a solar cell according to an example embodiment of the invention includes a first conductive type semiconductor substrate 100, a front passivation layer 120 formed at one surface (for example, a light receiving surface) of the semiconductor substrate 100, an anti-reflection layer 130 formed on the front passivation layer 120, a first doped region 141 that is formed at the other surface of the semiconductor substrate 100 and is heavily doped with first conductive type impurities, a second doped region 142 that is formed at the other surface of the semiconductor substrate 100 at a location adjacent to the first doped region 141 and is heavily doped with second conductive type impurities opposite the first conductive type impurities, a back passivation layer 150 exposing a portion of each of the first doped region 141 and the second doped region 142, an electron electrode 160 (hereinafter referred to as "a first electrode") electrically connected to the exposed portion of the first doped region 141, and a hole electrode 170 (hereinafter referred to as "a second electrode") electrically connected to the exposed portion of the second doped region 142.

The light receiving surface of the semiconductor substrate 100 is textured to form a textured surface corresponding to an uneven surface having a plurality of uneven portions 101. Thus, each of the front passivation layer 120 and the anti-reflection layer 130 has a textured surface.

The semiconductor substrate 100 is formed of first conductive type single crystal silicon (for example, n-type single crystal silicon), though not required. Alternatively, the semiconductor substrate 100 may be of a p-type and may be formed of polycrystalline silicon. Further, the semiconductor substrate 100 may be formed of other semiconductor materials other than silicon.

Because the light receiving surface of the semiconductor substrate 100 is the textured surface having the plurality of uneven portions 101, an absorptance of light increases. Hence, the efficiency of the solar cell is improved.

The front passivation layer 120 formed in the light receiving surface of the semiconductor substrate 100 having the plurality of uneven portions 101 is a region that is more heavily doped with impurities of a group V element such as phosphorus (P), arsenic (As), and antimony (Sb) than the semiconductor substrate 100. The front passivation layer 120 serves as a front surface field (FSF) layer similar to a back surface field (BSF) layer. Thus, a recombination and/or a disappearance of electrons and holes separated by incident light around the light receiving surface of the semiconductor substrate 100 are prevented or reduced.

The anti-reflection layer 130 on the surface of the front passivation layer 120 is formed of silicon nitride (SiNx) and/or silicon dioxide ($SiO_2$). The anti-reflection layer 130 reduces a reflectance of incident light and increases a selectivity of a predetermined wavelength band, thereby increasing the efficiency of the solar cell.

The first doped region 141 is a region that is more heavily doped with n-type impurities than the semiconductor substrate 100, and the second doped region 142 is a p-type heavily doped region. Thus, the p-type second doped region 142 and the n-type semiconductor substrate 100 form a p-n junction. The first doped region 141 and the second doped region 142 serve as a moving path of carriers electrons and holes) and respectively collect electrons and holes.

The back passivation layer 150 exposing a portion of each of the first doped region 141 and the second doped region 142 is formed of silicon nitride (SiNx), silicon dioxide ($SiO_2$), or a combination thereof. The back passivation layer 150 prevents or reduces a recombination and/or a disappearance of electrons and holes separated from carriers and reflects incident light to the inside of the solar cell so that the incident light is not reflected to the outside of the solar cell. Namely, the back passivation layer 150 prevents a loss of the incident light and reduces a loss amount of the incident light. The back passivation layer 150 may have a single-layered structure or a multi-layered structure such as a double-layered structure or a triple-layered structure.

The first electrode 160 is formed on the first doped region 141 not covered by the back passivation layer 150 and on a portion of the back passivation layer 150 adjacent to the first doped region 141 not covered by the back passivation layer 150. The second electrode 170 is formed on the second doped region 142 not covered by the back passivation layer 150 and on a portion of the back passivation layer 150 adjacent to the second doped region 142 not covered by the back passivation layer 150. Thus, the first electrode 160 is electrically connected to the first doped region 141, and the second electrode 170 is electrically connected to the second doped region 142. The first and second electrodes 160 and 170 are spaced apart from each other at a constant distance and extend parallel to each other in one direction.

As described above, because a portion of each of the first and second electrodes 160 and 170 overlaps a portion of the back passivation layer 150 and is connected to a bus bar area, a contact resistance and a series resistance generated when the first and second electrodes 160 and 170 contact an external driving circuit, etc. decrease. Hence, the efficiency of the solar cell is improved.

Since the first electrode 160 and the second electrode 170 have the same structure, only the first electrode 160 is described below.

As shown in FIG. 2, the first electrode 160 includes a metal seed layer 161, a diffusion barrier layer 162, and a conductive layer 163 that are sequentially formed on the first doped region 141.

In one embodiment, the metal seed layer 161 is formed of a material containing nickel, for example, nickel silicide (including $Ni_2Si$, NiSi, $NiSi_2$, etc.), and the metal seed layer 161 formed of nickel silicide has a thickness of about 50 nm to 200 nm. When the thickness of the metal seed layer 161 formed of nickel silicide is less than about 50 nm, a high resistance is obtained and it is difficult to form the uniform metal seed layer 161. Thus, it is difficult to secure the uniformity in a subsequent process, i.e., in a plating process of the diffusion barrier layer 162. When the thickness of the metal seed layer 161 formed of nickel silicide is greater than 200 nm, the metal seed layer 161 is distributed to silicon at a constant rate in a thermal process to form a nickel silicide layer. Thus, a shunt leakage may occur because of the distribution of nickel.

In another embodiment, the metal seed layer 161 is formed of a material containing vapor deposited aluminum, and the metal seed layer 161 formed of vapor deposited aluminum has a thickness of about 50 nm to 200 nm. The metal seed layer 161 formed of vapor deposited aluminum is used as a seed layer of a plating process through zincate processing in a subsequent process. When the thickness of the metal seed layer 161 formed of vapor deposited aluminum is less than about 50 nm, a high resistance is obtained and it is difficult to form the uniform metal seed layer 161. Thus, it is difficult to secure the uniformity in a subsequent process, i.e., in a plating process of the diffusion barrier layer 162. Further, as long as the metal seed layer 161 formed of vapor deposited aluminum Al—Si ohmic contacts the doped silicon surface, an effect of the metal seed layer 161 may be obtained. Therefore, the thickness of the metal seed layer 161 does not need to be greater than 200 nm.

The diffusion barrier layer 162 on the metal seed layer 161 formed of nickel silicide or vapor deposited aluminum prevents the generation of junction degradation resulting from a diffusion of a formation material of the conductive layer 163 to a silicon interface through the metal seed layer 161. The diffusion barrier layer 162 includes a nickel layer having a thickness of about 5 μm to 15 μm.

The conductive layer 163 on the diffusion barrier layer 162 is formed of at least one conductive metal material. Examples of the at least one conductive metal material include at least one selected from the group consisting of nickel (Ni), copper (Cu), silver (Ag), aluminum (Al), tin (Sn), zinc (Zn), indium (In), titanium (Ti), gold (Au), and a combination thereof. Other materials may be used for the conductive layer 163.

In the example embodiment of the invention, the conductive layer 163 includes a copper layer 163a. The copper layer 163a serves substantially as an electrical wire and has a thickness of about 10 μm to 30 μm.

However, copper is easy to oxidize in the air, and it may be not easy to perform a process for directly soldering an interconnector, for example, a ribbon (not shown) for electrically connecting adjacent solar cells to the copper layer 163a in a module process using copper. Thus, when the conductive layer 163 includes the copper layer 163a, the conductive layer 163 further includes a tin layer 163b capable of preventing oxidization of copper and smoothly performing the soldering process of the ribbon. The tin layer 163b on the copper layer 163a has a thickness of about 5 μm to 15 μm.

When the conductive layer 163 includes a conductive layer formed of another conductive metal material other than the copper layer 163a, the tin layer 163b may be omitted if the conductive layer is not easy to oxidize in the air and is used to smoothly perform the soldering process of the ribbon.

A method of manufacturing the solar cell according to the example embodiment of the invention is described below with reference to FIGS. 3A to 3K.

FIGS. 3A to 3K are process flow charts sequentially illustrating a method of manufacturing the solar cell according to the example embodiment of the invention.

Figure 3A:
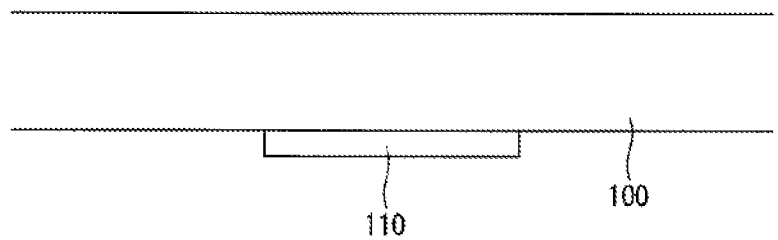
FIGS. 3A to 3K are views sequentially illustrating a method of manufacturing a solar cell according to an example embodiment of the invention.

As shown in FIG. 3A, first, a doping and shielding paste 110 containing boron (B) is selectively applied onto the semiconductor substrate 100 formed of n-type single crystal silicon and then is hardened through thermal processing. In this case, the doping and shielding paste 110 is applied onto a region that will be heavily doped with p-type impurities.

The doping and shielding paste 110 serves as a doping layer for doping a desired region with corresponding impurities, for example, the p-type impurities. In addition, the doping and shielding paste 110 serves as a shielding layer for preventing a undesired region of the semiconductor substrate 100 from being doped with impurities (for example, n-type impurities) contained in a phosphorus (P)-doped layer 140 applied onto the doping and shielding paste 110.

The doping and shielding paste 110 may be applied onto a desired portion through a screen printing method using a screen mask, a sputtering method, or a direct printing method. A dopant included in the doping and shielding paste 110 may use a group 111 element such as gallium (Ga) and indium (In) other than boron (B). The doping and shielding paste 110 may be hardened through rapid thermal processing (RTP) of about 300° C. to 700° C. or a hot plate for about 3 to 5 minutes. Other hardening processes may be used.

Figure 3B:
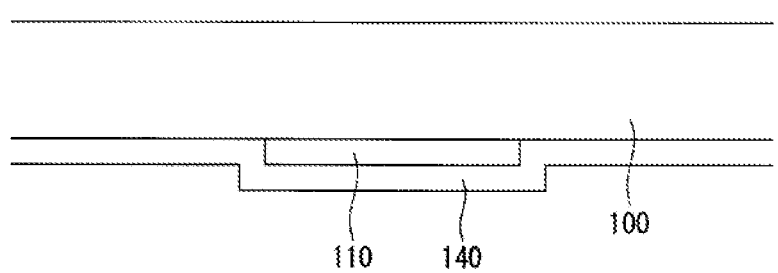

Next, as shown in FIG. 3B, a spin-on dopant solution doped with phosphorus is spin coated on the entire other surface (opposite the light receiving surface) of the semiconductor substrate 100 and is dried to form the P-doped layer 140.

Figure 3C:
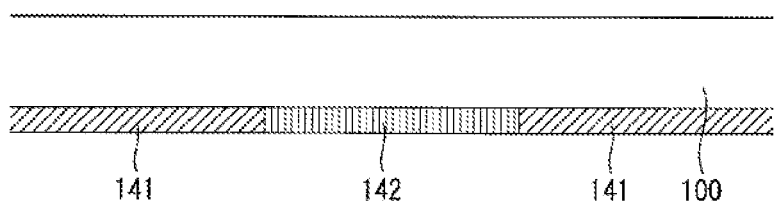

Next, as shown in FIG. 3C, thermal processing is performed on the semiconductor substrate 100 in a diffusion furnace of about 850° C. to diffuse boron and phosphorus into the semiconductor substrate 100. More specifically, impurities i.e., phosphorus) are diffused into the semiconductor substrate 100 in a direct contact portion between the P-doped layer 140 and the semiconductor substrate 100 to form the first doped region 141. Further, impurities (i.e., boron) are diffused into the semiconductor substrate 100 in a direct contact portion between the doping and shielding paste 110 and the semiconductor substrate 100 to form the second doped region 142. After the first and second doped regions 141 and 142 are formed, the doping and shielding paste 110 and the P-doped layer 140 are removed.

The first doped region 141 may be formed by doping the semiconductor substrate 100 with impurities of a group V element such as As and Sb instead of phosphorus, and the second doped region 142 may be formed by doping the semiconductor substrate 100 with impurities of a group III element such as Ga and In instead of boron.

Because the first doped region 141 providing the moving path of electrons and the second doped region 142 for the p-n junction are formed through one process using the doping and shielding paste 110 capable of simultaneously serving as both the doping layer and the shielding layer, the number of manufacturing processes and manufacturing time can be reduced.

The semiconductor substrate 100 may be formed of p-type silicon. In this case, the first and second doped regions 141 and 142 may be formed through the above-described processes using a paste doped with a group V element such as phosphorus instead of a boron-doped paste and a spin-on dopant solution doped with a group III element such as boron.

Characteristics such as a surface resistance and a junction depth of each of the first and second doped regions 141 and 142 thus formed may vary depending on process conditions such as a resistance, a diffusion temperature, and a process time of the semiconductor substrate 100. Thus, the process conditions of the semiconductor substrate 100 are optimized so that each of the first and second doped regions 141 and 142 has the optimum characteristics.

Before the doping and shielding paste 110 used to form the first and second doped regions 141 and 142 is applied onto the semiconductor substrate 100, a saw damage removal process and a cleansing process may be performed on the semiconductor substrate 100 to improve a surface state of the semiconductor substrate 100. Since the saw damage removal process and the cleansing process are well known to those skilled in the art, descriptions thereof are omitted.

Figure 3D:
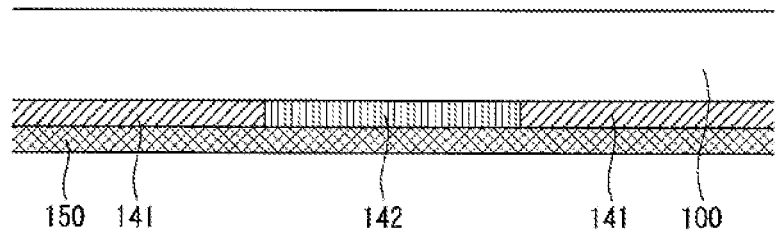

Next, as shown in FIG. 3D, an oxide layer such as a silicon dioxide ($SiO_2$) layer is grown at a high temperature to form the back passivation layer 150. The process for forming the back passivation layer 150 may be performed at about 1,000° C.

When it is difficult to obtain the back passivation layer 150 having a desired thickness through a high temperature growth or a degradation of the characteristics of the solar cell is generated because the oxide layer is grown at a high temperature for a long time, a silicon dioxide ($SiO_2$) layer may be additionally deposited using a chemical vapor deposition (CVD) method such as a plasma enhanced CVD (PECVD) method.

The back passivation layer 150 may be formed using silicon nitride (SiNx). The back passivation layer 150 may be formed using an organic insulating material as well as an inorganic insulating material such as silicon nitride (SiNx) and silicon dioxide ($SiO_2$).

Figure 3E:
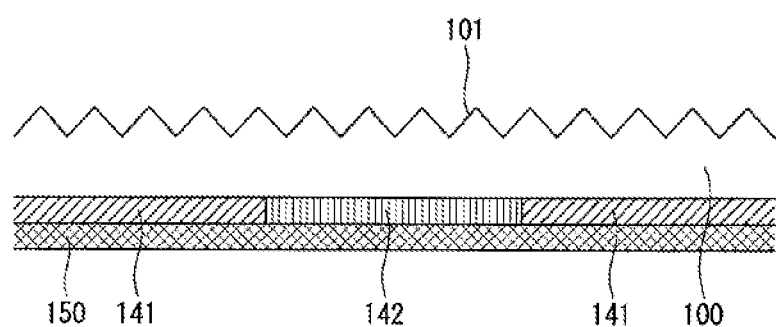

Next, as shown in FIG. 3E, a texturing process is performed on the light receiving surface of the semiconductor substrate 100, on which the back passivation layer 150 is not formed, using the back passivation layer 150 as a mask to form the plurality of uneven portions 101 on the light receiving surface of the semiconductor substrate 100. The texturing process is generally performed by immersing the semiconductor substrate 100 in a bath filled with an alkali solution for a predetermined time.

For example, the texturing process may be performed in the alkali solution of about 80° C. for about 20 to 40 minutes. When the texturing process is performed, the other surface (opposite the light receiving surface) of the semiconductor substrate 100 protected by the back passivation layer 150 is not etched, and the light receiving surface of the semiconductor substrate 100 not protected by the back passivation layer 150 is etched. Thus, the plurality of uneven portions 101 each having an uneven pyramid structure is formed.

Because an etch rate of the semiconductor substrate 100 varies depending on a crystal orientation of the semiconductor substrate 100, the uneven portions are formed on the surface of the semiconductor substrate 100 through the texturing process.

Further, because the back passivation layer 150 formed of silicon dioxide ($SiO_2$) has an etch resistance to the alkali solution, the back passivation layer 150 does not react on a texturing reaction using the alkali solution.

Examples of the alkali solution include KOH solution of about 2 wt % to 5 wt %, NaOH solution of about 2 wt % to 5 wt %, and $NH_4OH$ solution.

A height of each uneven portion 101 thus formed, i.e., a height of each pyramid structure may be about 1 μm to 10 μm.

Figure 3F:
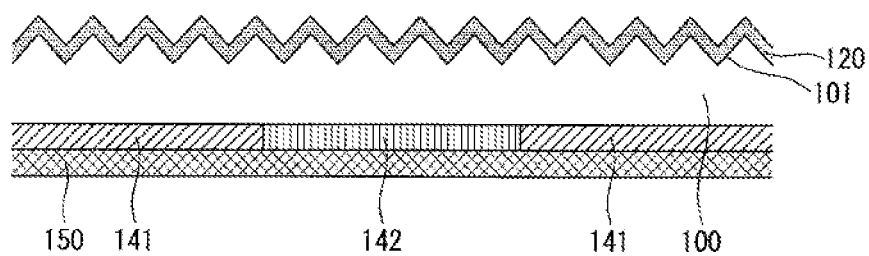
Figure 3G:
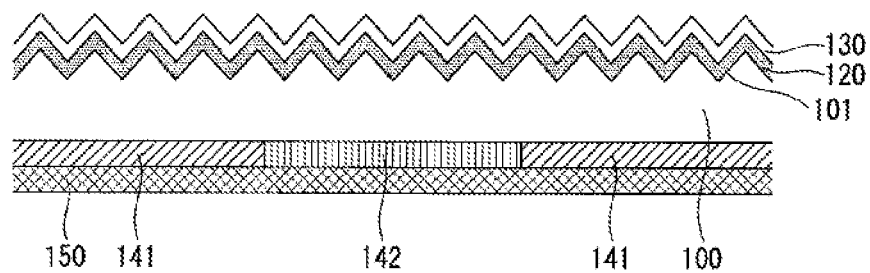

Next, as shown in FIG. 3F, the entire textured surface of the semiconductor substrate 100 is more heavily doped with impurities of the same conductive type (for example, n-type) as the conductive type of the semiconductor substrate 100 than the semiconductor substrate 100. Hence, the front passivation layer 120 is formed. When the n-type front passivation layer 120 is formed, a doping material of a group V element such as P, As, and Sb may be used.

Next, as shown in FIG. 3O, the anti-reflection layer 130 is formed on the entire surface of the front passivation layer 120. The anti-reflection layer 130 may be generally a silicon nitride (SiNx) layer or a silicon dioxide ($SiO_2$) layer formed using the CVD method such as the PECVD method or a sputtering method. The anti-reflection layer 130 may have two layers each having different physical properties. In this case, a lower layer of the two layers may be formed of a material having a high refractive index of about 2.2 to 2.6, and an upper layer may be formed of a material having a low refractive index of about 1.3 to 1.6.

Figure 3H:
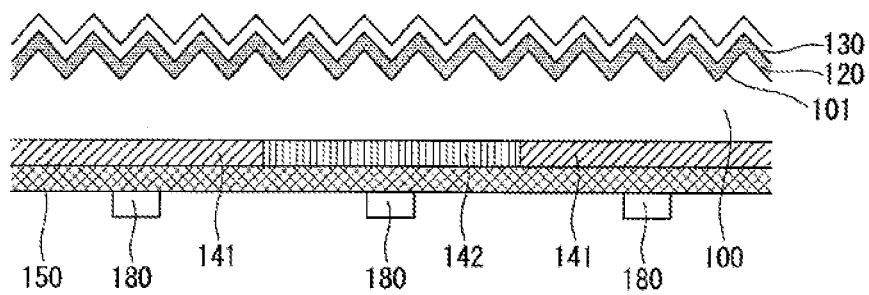
Figure 3I:
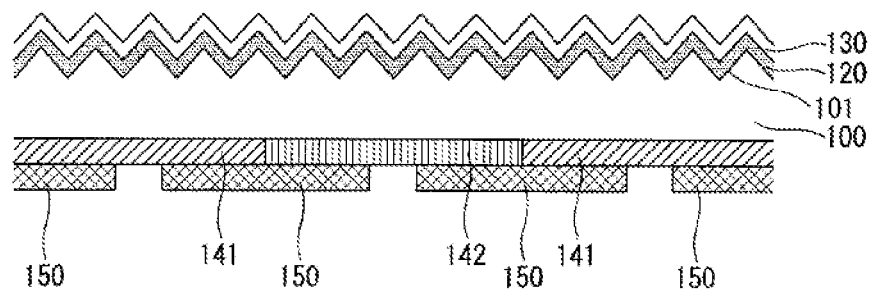

Next, as shown in FIGS. 3H and 3I, an etching paste 180 is formed on a desired portion of the back passivation layer 150. The etching paste 180 is used to expose a portion of each of the first and second doped regions 141 and 142 respectively connected to the first and second electrodes 160 and 170. The etching paste 180 is formed on portions of the back passivation layer 150 corresponding to the portions of the first and second doped regions 141 and 142 to be exposed. The etching paste 180 may include an etchant such as phosphoric acid and hydrofluoric acid.

After the etching paste 180 is formed, thermal processing is performed at a proper temperature and time, for example, at a temperature of about 50° C. to 500° C. for about 1 to 5 minutes to selectively etch the portions of the back passivation layer 150 where the etching paste 180 is formed. Hence, the portion of each of the first and second doped regions 141 and 142 is exposed.

Subsequently, the remaining etching paste 180 is removed using water. When the remaining etching paste 180 is not completely removed, the remaining etching paste 180 may be additionally removed using ultrasonic waves. Hence, the back passivation layer 150 exposes the portion of each of the first and second doped regions 141 and 142.

In addition, an etch resist removing a portion of the back passivation layer 150 may be used to expose the portion of each of the first and second doped regions 141 and 142. More specifically, the etch resist is formed in a remaining portion except the portions of the back passivation layer 150 corresponding to the portions of the first and second doped regions 141 and 142 to be exposed. Then, an etching process is performed using the etch resist as a mask to remove the back passivation layer 150 of non-formation portions of the etch resist. Hence, the portion of each of the first and second doped regions 141 and 142 may be exposed.

According to the above-described characteristics, the first and second doped regions 141 and 142 are simultaneously formed using first and second layers, an etching paste is selectively applied to only a desired portion, and the thermal processing is performed on the etching paste. Hence, the portion of each of the first and second doped regions 141 and 142 may be selectively exposed. The number of processes and an amount of material used in the above-described method may be greatly reduced, compared with a general photolithographic etching process.

Figure 3J:
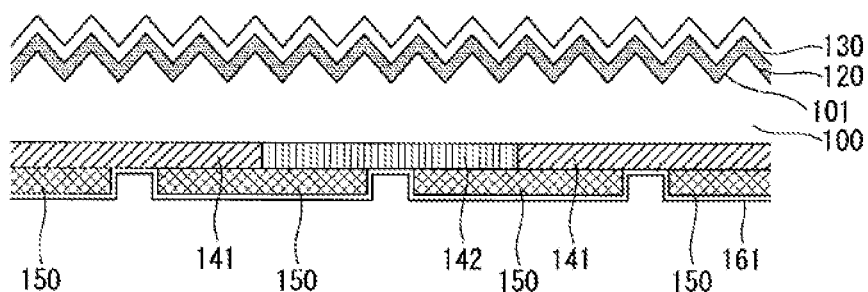

Next, as shown in FIG. 3J, the metal seed layer 161 is formed on the entire surface of the back passivation layer 150 and the exposed portion of each of the first and second doped regions 141 and 142. As described above, the metal seed layer 161 is formed of nickel silicide or vapor deposited aluminum.

First, when the metal seed layer 161 is formed of nickel silicide, the metal seed layer 161 may be formed by depositing nickel to a thickness of about 50 nm to 200 nm using a vacuum method, for example, a sputtering method or an electron beam evaporation method and then performing thermal processing at a temperature of about 300° C. to 600° C. in the nitrogen atmosphere.

Alternatively, the metal seed layer 161 formed of nickel silicide may be formed by depositing nickel to a thickness of about 50 nm to 200 nm using an electroless nickel plating process and then performing thermal processing at a temperature of about 300° C. to 600° C. in the nitrogen atmosphere.

According to the above-described process, the metal seed layer 161 formed of nickel silicide (including $Ni_2Si$, NiSi, $NiSi_2$, etc.) is formed.

According to the above-described characteristics, a nickel seed layer is formed on the first and second doped regions 141 and 142 and directly contacts the first and second doped regions 141 and 142. Further, the nickel seed layer simultaneously serves as a diffusion barrier layer for preventing the diffusion of copper and as an electrode in an electroplating process used to form a conductive layer.

Accordingly, the diffusion barrier layer and the conductive layer formed on the metal seed layer may be formed using the plating process more inexpensive than the vacuum process.

In the other hand, when the metal seed layer 161 is formed of vapor deposited aluminum, the metal seed layer 161 may be formed by depositing aluminum to a thickness of about 50 nm to 200 nm using the vacuum method, for example, the sputtering method or the electron beam evaporation method, performing thermal processing at a temperature of about 350° C. to 500° C. in the hydrogen atmosphere of about 3% to 50%, and performing zincate processing on the aluminum surface.

In the example embodiment of the invention, the zincate processing performed on the aluminum surface is preprocessing for forming a metal plating layer on aluminum. When the zincate processing is performed on the aluminum surface, the diffusion barrier layer 162 may be smoothly electroplated on the metal seed layer 161. Since the zincate processing is well known to those skilled in the art, a description thereof is omitted.

According to the above-described characteristics, an aluminum seed layer is formed on the first and second doped regions 141 and 142 and directly contacts the first and second doped regions 141 and 142. Further, the zincate-processed aluminum seed layer simultaneously serves as a diffusion barrier layer for preventing the diffusion of copper and as an electrode in an electroplating process used to form a conductive layer.

Accordingly, the existing vacuum process, in which an ohmic formation layer directly contacting each of the first and second doped regions, a copper diffusion barrier layer, and the metal seed layer for the electroplating process are formed through the vacuum process, can be greatly simplified, and thus the manufacturing cost can be greatly reduced. In other words, the diffusion barrier layer and the conductive layer formed on the metal seed layer may be formed using the plating process more inexpensive than the vacuum process.

Figure 3K:
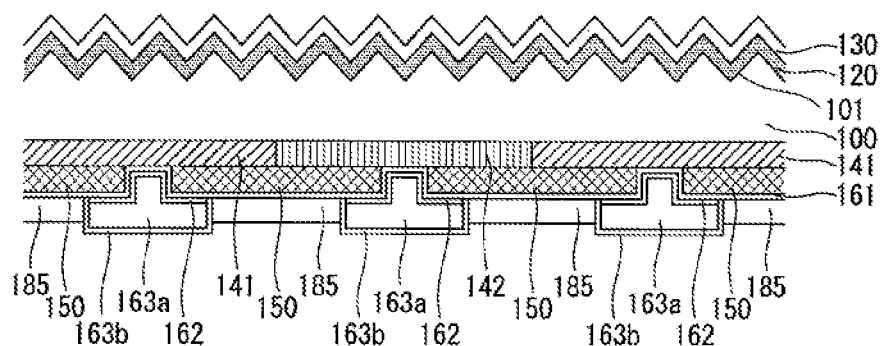

After the metal seed layer 161 formed of nickel silicide or vapor deposited aluminum is formed, as shown in FIG. 3K, a barrier layer 185 is formed on the metal seed layer 161 so as to form the diffusion barrier layer 162 and the conductive layer 163 in a portion of the metal seed layer 161.

Subsequently, the electroplating process is performed to sequentially form a nickel diffusion barrier layer 162 having a thickness of about 5 μm to 15 μm, a copper layer 163*a* having a thickness of about 10 μm to 30 μm, and a tin layer 163*b* having a thickness of about 5 μm to 15 μm on the metal seed layer 161.

Subsequently, after the barrier layer 185 is removed, an etching process is performed using the tin layer 163*b* as a mask to remove an exposed portion of the metal seed layer 161. Hence, the solar cell of FIG. 1 having the first and second electrodes 160 and 170 shown in FIG. 2 is completed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a solar cell, the method comprising:
    forming a first doped region of a first conductive type and a second doped region of a second conductive type opposite the first conductive type on a first side of a semiconductor substrate of the first conductive type;
    forming a first passivation layer on the first doped region and the second doped region, the first passivation layer being formed of silicon nitride (SiNx), silicon oxide (SiOx), or a combination thereof and having a single-layered structure or a multi-layered structure;
    forming a textured structure on an entire second side of the semiconductor substrate opposite to the first side of the semiconductor substrate;
    forming a second passivation layer on the second side of the semiconductor substrate;
    forming an anti-reflection layer on the second passivation layer;
    removing a portion of the first passivation layer to expose a portion of each of the first and second doped regions; and
    forming a first electrode electrically connected to the first doped region and a second electrode electrically connected to the second doped region,
    wherein the forming of the first and second electrodes includes respectively;
    forming a metal seed layer having a first portion directly contacting one of the first doped region and the second doped region, and a second portion directly contacting the first passivation layer,
    forming a diffusion barrier layer on the metal seed layer,
    forming a first conductive layer on the diffusion barrier layer by plating,
    forming a second conductive layer on an exposed surface of the first conductive layer including a bottom surface and side surfaces of the first conductive layer by plating,
    wherein the forming of the first and second doped regions includes:
    forming a first layer containing first impurities of the second conductive type on a portion of the semiconductor substrate to form the second doped region;
    forming a second layer containing second impurities of the first conductive type on the first layer and the semiconductor substrate to form the first doped region; and
    diffusing the first impurities of the first layer and the second impurities of the second layer to form the first doped region and the second doped region on the substrate,
    wherein the first layer is formed both for doping for the second doped region with the first impurities and shielding for the second impurities, and
    wherein the first doped region and the second doped region are disposed at the same level of the semiconductor substrate.

2. The method of claim 1, wherein the forming of the metal seed layer includes depositing a seed material containing nickel.

3. The method of claim 2, wherein the forming of the metal seed layer is performed by a vacuum method including a sputtering method and an electron beam evaporation method.

4. The method of claim 1, wherein the forming of the metal seed layer includes depositing nickel unto a surface of each of the first and second doped regions through an electroless plating method using an electrolyte containing a nickel precursor and performing a thermal processing.

5. The method of claim 1, wherein the forming of the metal seed layer includes depositing a seed material containing aluminum.

6. The method of claim 5, wherein the depositing of the seed material containing aluminum is carried out using a vacuum method including a sputtering method and an electron beam evaporation method.

7. The method of claim 6, wherein the seed material containing aluminum is deposited to a thickness of about 50 nm to 200 nm.

8. The method of claim 5, wherein the forming of the metal seed layer further includes performing a thermal processing on vapor deposited aluminum.

9. The method of claim 8, wherein the thermal processing of vapor deposited aluminum is performed at a temperature of about 350° C. to 500° C. in a hydrogen atmosphere.

10. The method of claim 1, wherein the first conductive layer is formed of at least one selected from the group consisting of copper (Cu), silver (Ag), aluminum (Al), tin (Sn), zinc (Zn), indium (In), titanium (Ti), gold (Au), and a combination thereof.

11. The method of claim 10, wherein the forming of the first conductive layer includes plating copper on the diffusion barrier layer to form a copper layer.

12. The method of claim 1, wherein the forming of the diffusion barrier layer includes plating nickel on the metal seed layer to a thickness of about 5 μm to 15 μm.

13. The method of claim 1, wherein the first and second doped regions are simultaneously formed.

14. The method of claim 3, further comprising performing a thermal processing at a temperature of about 300° C. to 600° C. in a nitrogen atmosphere after the depositing the seed material containing nickel,
wherein the metal seed layer has a thickness of about 50 nm to 200 nm.

15. The method of claim 4, wherein the metal seed layer has a thickness of about 50 nm to 200 nm, and the performing of the thermal processing is performed at a temperature of about 300° C. to 600° C. in the nitrogen atmosphere.

16. The method of claim 5, wherein the forming of the metal seed layer further includes performing a zincate processing on an aluminum surface.

17. The method of claim 11, wherein the forming of the second conductive layer includes plating tin on the copper layer to form a tin layer.

18. The method of claim 17, wherein the tin layer covers side surfaces of the diffusion barrier layer.

19. The method of claim 12, wherein the forming of the diffusion barrier layer is performed by an electroplating method.

20. The method of claim 1, wherein when the forming the textured structure is performed, the first passivation layer is used as a mask.

21. The method of claim 1, further comprising forming a barrier layer on the metal seed layer to prevent plating.

22. The method of claim 21, wherein the first conductive layer is formed on the metal seed layer, on which the barrier layer is not formed.

23. The method of claim 21, wherein the barrier layer is removed after the first conductive layer is formed.

* * * * *